United States Patent
Lin et al.

(10) Patent No.: US 11,081,475 B2
(45) Date of Patent: Aug. 3, 2021

(54) INTEGRATED CIRCUIT STRUCTURE AND METHOD FOR REDUCING POLYMER LAYER DELAMINATION

(71) Applicant: Taiwan Semiconductor Manufacturing Company, Ltd., Hsinchu (TW)

(72) Inventors: Jing-Cheng Lin, Hsinchu (TW); Jui-Pin Hung, Hsinchu (TW); Hsien-Wen Liu, Hsinchu (TW); Min-Chen Lin, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 217 days.

(21) Appl. No.: 15/443,827

(22) Filed: Feb. 27, 2017

(65) Prior Publication Data
US 2017/0170161 A1   Jun. 15, 2017

Related U.S. Application Data

(62) Division of application No. 13/901,311, filed on May 23, 2013, now Pat. No. 9,583,424.

(51) Int. Cl.
*H01L 23/48* (2006.01)
*H01L 23/52* (2006.01)
(Continued)

(52) U.S. Cl.
CPC .............. *H01L 25/50* (2013.01); *H01L 21/56* (2013.01); *H01L 23/3114* (2013.01);
(Continued)

(58) Field of Classification Search
CPC ......... H01L 21/56; H01L 24/11; H01L 24/81; H01L 25/065; H01L 25/50; H01L 2924/00014; H01L 2224/96; H01L 2224/05166; H01L 2224/05647; H01L 2224/131; H01L 2224/13147; H01L 2924/181; H01L 2224/03; H01L 2224/11; H01L 2224/11013; H01L 2224/1148; H01L 2924/00; H01L 2924/014; H01L 21/568;
(Continued)

(56) References Cited

U.S. PATENT DOCUMENTS

2004/0209126 A1    10/2004  Ziegler et al.
2006/0291029 A1*  12/2006  Lin .......................... H01L 24/11
                                                              257/622

(Continued)

OTHER PUBLICATIONS

Topper, M., et al., "A Comparison of Thin Film Polymers for Wafer Level Packaging," Electronic Components and Technology Conference, Jun. 1-4, 2010, pp. 769-776.

*Primary Examiner* — Meiya Li
(74) *Attorney, Agent, or Firm* — Slater Matsil, LLP

(57) ABSTRACT

An embodiment integrated circuit structure includes a substrate, a metal pad over the substrate, a post-passivation interconnect (PPI) structure over the substrate and electronically connected to the metal pad, a first polymer layer over the PPI structure, an under bump metallurgy (UBM) extending into an opening in the first polymer layer and electronically connected to the PPI structure, and a barrier layer on a top surface of the first polymer layer adjacent to the UBM.

20 Claims, 9 Drawing Sheets

(51) Int. Cl.
*H01L 29/40* (2006.01)
*H01L 25/00* (2006.01)
*H01L 23/498* (2006.01)
*H01L 23/00* (2006.01)
*H01L 23/31* (2006.01)
*H01L 23/525* (2006.01)
*H01L 23/532* (2006.01)
*H01L 23/538* (2006.01)
*H01L 21/56* (2006.01)
*H01L 25/065* (2006.01)

(52) U.S. Cl.
CPC ...... *H01L 23/3171* (2013.01); *H01L 23/3192* (2013.01); *H01L 23/49811* (2013.01); *H01L 23/525* (2013.01); *H01L 23/5329* (2013.01); *H01L 23/5389* (2013.01); *H01L 24/11* (2013.01); *H01L 24/19* (2013.01); *H01L 24/81* (2013.01); *H01L 25/065* (2013.01); *H01L 21/568* (2013.01); *H01L 2224/0401* (2013.01); *H01L 2224/04105* (2013.01); *H01L 2224/05027* (2013.01); *H01L 2224/05166* (2013.01); *H01L 2224/05582* (2013.01); *H01L 2224/05647* (2013.01); *H01L 2224/11013* (2013.01); *H01L 2224/1134* (2013.01); *H01L 2224/1148* (2013.01); *H01L 2224/12105* (2013.01); *H01L 2224/131* (2013.01); *H01L 2224/13147* (2013.01); *H01L 2224/96* (2013.01); *H01L 2924/181* (2013.01); *H01L 2924/18162* (2013.01)

(58) Field of Classification Search
CPC ... H01L 2224/0401; H01L 2224/04105; H01L 2224/05027; H01L 2224/05582; H01L 2224/1134; H01L 2224/12105; H01L 23/3114; H01L 23/3171; H01L 23/3192; H01L 23/49811; H01L 23/525; H01L 23/5329; H01L 23/5389; H01L 24/19; H01L 2924/18162
USPC ................. 257/737, 738, E21.506, E23.068; 438/106
See application file for complete search history.

(56) References Cited

U.S. PATENT DOCUMENTS

| | | | | |
|---|---|---|---|---|
| 2011/0012239 | A1* | 1/2011 | Gu | H01L 21/6836 257/637 |
| 2011/0101527 | A1* | 5/2011 | Cheng | H01L 24/11 257/738 |
| 2011/0309490 | A1* | 12/2011 | Lu | H01L 23/293 257/737 |
| 2012/0056167 | A1* | 3/2012 | Lau | B29C 67/0062 257/40 |
| 2013/0001776 | A1* | 1/2013 | Yu | H01L 21/568 257/738 |

* cited by examiner

INTEGRATED CIRCUIT STRUCTURE AND METHOD FOR REDUCING POLYMER LAYER DELAMINATION

This application is a divisional of U.S. patent application Ser. No. 13/901,311, filed on May 23, 2013, entitled "Integrated Circuit Structure and Method for Reducing Polymer Layer Delamination," which application is hereby incorporated herein by reference.

This application relates to the following co-pending and commonly assigned patent application: Ser. No. 13/800,653, filed Mar. 13, 2013, entitled "Improved Adhesion between Post-Passivation Interconnect Structure and Polymer," which application is hereby incorporated herein by reference.

BACKGROUND

A typical integrated circuit structure is made up of dies that include active devices such as transistors and capacitors. These devices are initially isolated from each other, and interconnect structures are later formed over the active devices to create functional circuits. On top of the interconnect structures, bond pads are formed and exposed on the surface of the respective die. Electrical connections are made through the bond pads to connect the die to a package substrate or another die. In certain categories of conventional packaging technologies, such as fan-out wafer level packaging (FO-WLP), a post-passivation interconnect (PPI) structure (also known as redistribution layers (RDLs)) may be formed over the passivation layers of a die and electrically connected to the bond pads. This is followed by the formation of a polymer layer and under bump metallurgies (UBMs). The UBMs are formed in openings penetrating through the second polymer and electrically connected to the PPI structure. I/O pads such as solder balls may then be placed on the UBMs. An advantageous feature of this packaging technology is the possibility of forming fan-out packages, which means the I/O pads on a die can be redistributed to a greater area than the die, and hence the number of I/O pads packed on the surfaces of the dies can be increased. However, an issue with this packaging technology is reliability concerns regarding delamination of the polymer layer. Delamination issues have been observed in typical FO-WLP wafers subject to various durability tests, such as a PCT-168hrs test, wherein the wafer is stressed under a high heat, pressure, and humidity condition for 168 hours. These delamination issues may further cause I/O pad breakages in the integrated circuit.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Various embodiments will be described with respect to a specific context, namely a fan-out wafer level packaging (FO-WLP) technology. Other embodiments may also be applied, however, to other packaging technologies such as wafer level chip scale packaging (WLCSP) or interposers having redistribution layers (RDLs).

FIGS. 1-6 illustrate cross-sectional views of various stages of manufacturing an integrated circuit structure according to various embodiments. A post-passivation interconnect (PPI) structure is formed over a die or a wafer to redistribute or redirect I/O pads in the wafer to a larger or different area. A polymer layer is formed over the PPI structure, followed by the formation of under bump metallurgies (UBMs) electrically connected to the PPI structure. A barrier layer is then formed on the exposed polymer layer for blocking moisture and reducing delamination.

Figure 1:
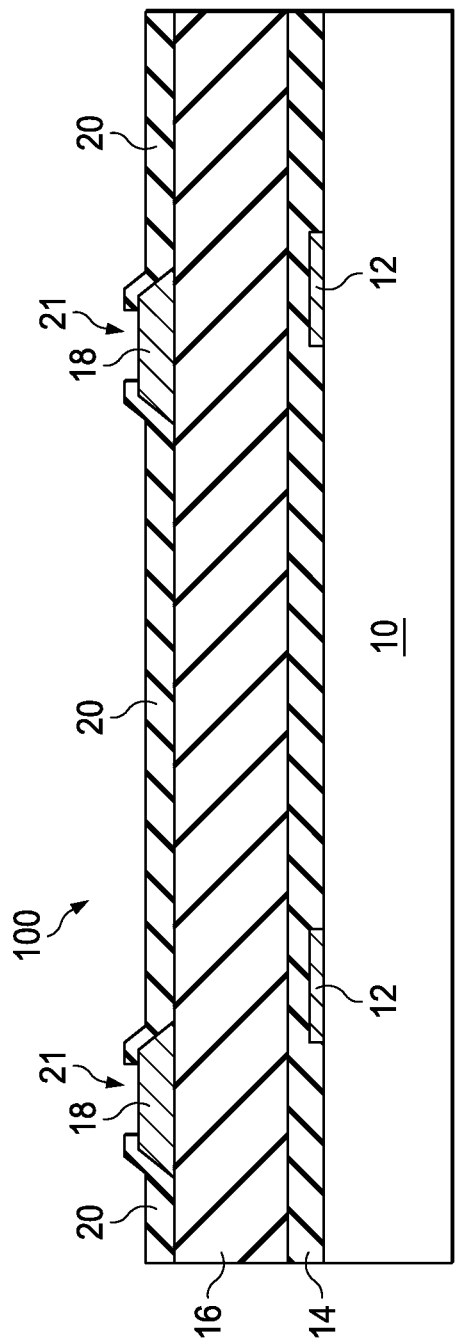
FIGS. 1-8 are cross-sectional views of intermediate stages of manufacture of an integrated circuit structure in accordance with various embodiments.

FIG. 1 illustrates a side view of a die 100, which includes a substrate 10. The substrate 10 may be a bulk silicon substrate although other semiconductor materials including group III, group IV, and group V elements may also be used. Active devices 12 such as transistors may be formed in and/or on the substrate 10. An inter-layer dielectric (ILD) 14 is formed over substrate 10, and various inter-metal dielectric layers (IMDs) 16 are formed over ILD 14. In some embodiments, the ILD 14 and/or IMDs 16 include at least one dielectric layer formed of low-k dielectric materials having k values, for example, lower than about 4.0. In some embodiments, the ILD 14 and/or the IMDs 16 may be made of, for example, silicon oxide, SiCOH, and the like.

Metal pads 18 are formed over the IMDs 16 and are electrically coupled to the active devices 12 through various metallic lines and vias (not shown) in the IMDs 16. The metal pads 18 may be made of aluminum, aluminum alloy, copper or copper alloy, although other metallic materials may be used. Passivation layer 20 is formed over the IMDs 16 and may be formed of non-organic materials such as silicon oxide, un-doped silicate glass, silicon oxynitride, and the like. Openings 21 are formed in portions of the passivation layer 20 to expose central portions of metal pads 18. Portions of passivation layer 20 may also cover edge portions of the metal pads 110. The formation details of the various features in FIG. 1 are well known in the art and not described herein.

Figure 2:
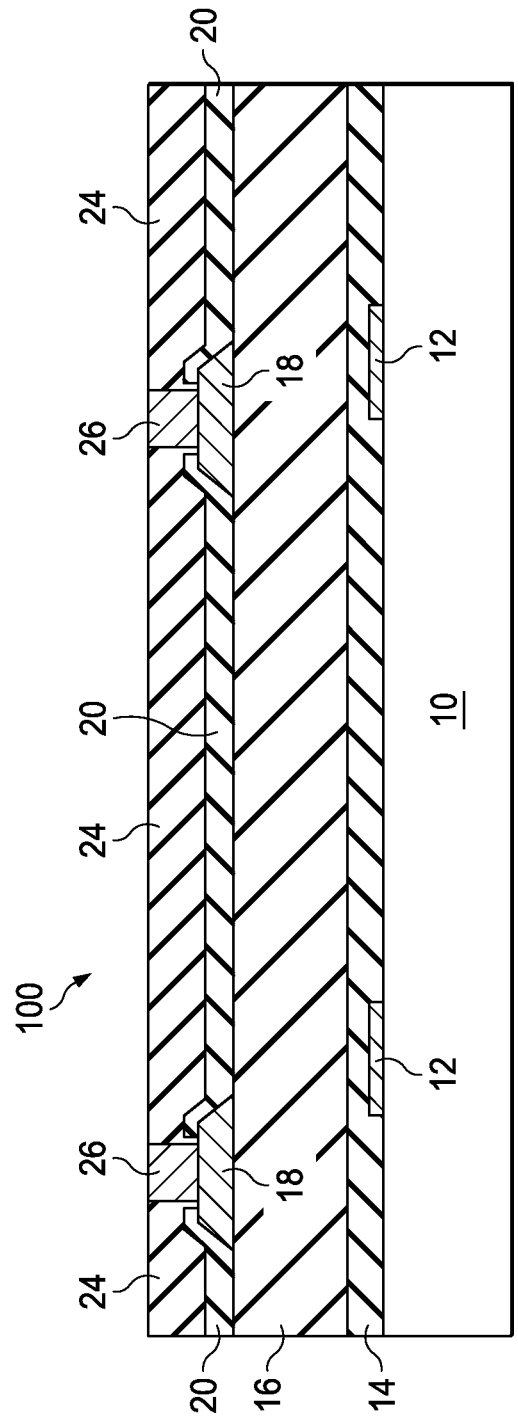

FIG. 2 illustrates the formation of a first polymer layer 24 over the passivation layer 20. The first polymer layer 24 may be formed of a material such as polyimide (PI), polybenzoxazole (PBO), benzocyclobuten (BCB), epoxy, silicone, acrylates, nano-filled pheno resin, siloxane, fluorinated polymer, polynorbornene, and the like. The first polymer layer 24 is patterned to expose portions of the metal pads 18 using, for example, a combination of photolithographic techniques and etching. Post-passivation interconnect (PPI, so named because they are formed after the formation of passivation layer 20) pads 26 may be formed on and electrically connect to the metal pads 18 through the openings in passivation layer 20 and the first polymer layer 24. The PPI pads 26 may alternatively be referred to as redistribution layer (RDL) pads 26. The first polymer layer 24 may be formed using, for example, spin on coating techniques. The PPI pads 26, may be formed of copper or a copper alloy although other metals such as aluminum or gold may be used. The formation methods of PPI pads 26 may include plating, electroless plating, sputtering, chemical vapor deposition (CVD), and the like. Usually an opening is filled with the metal and surface of the substrate covered by the process. Excess metal is then removed. The surface may be planarized in a chemical mechanical polishing (CMP) process.

Figure 3:
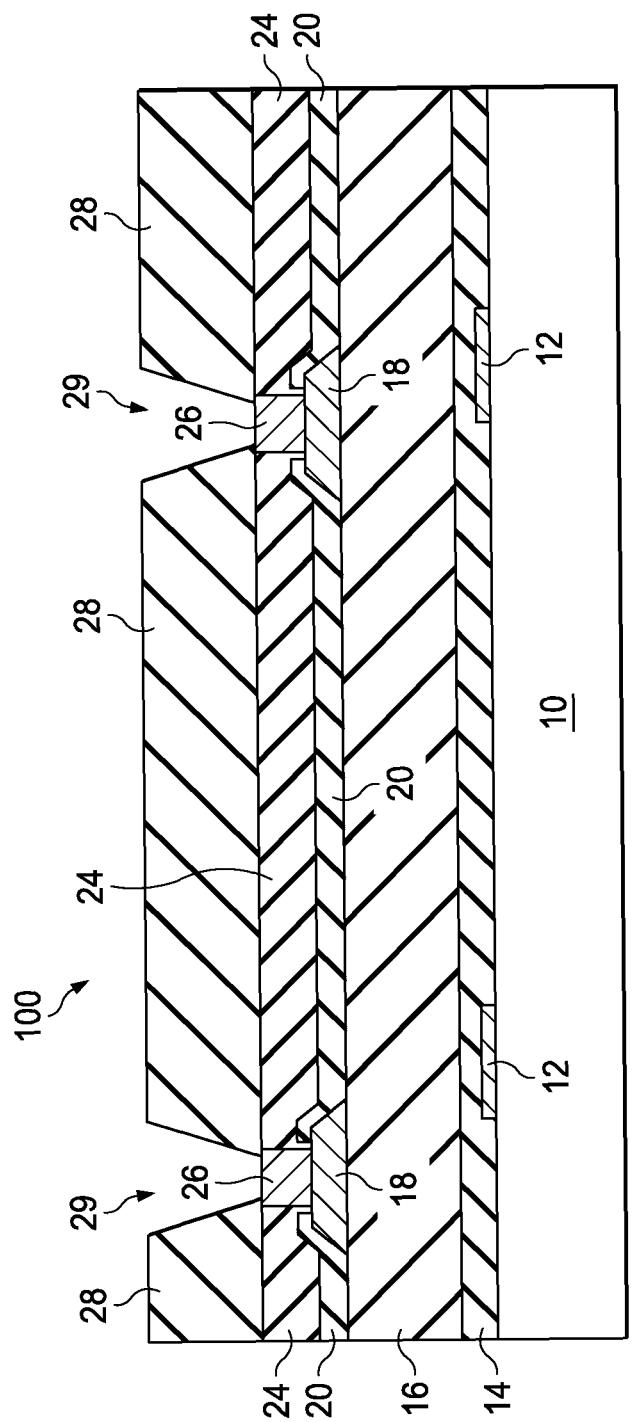

FIG. 3 shows the formation of a second polymer layer 28 over the first polymer layer 24. The second polymer layer 28 may be formed of the same material as the first polymer layer 24 using the same methods, or may be formed of a different material and/or using different methods. The second polymer layer 28 may be patterned to expose portions of the PPI pads 26 using the same methods as the methods used in patterning the first polymer layer 24.

Figure 4:
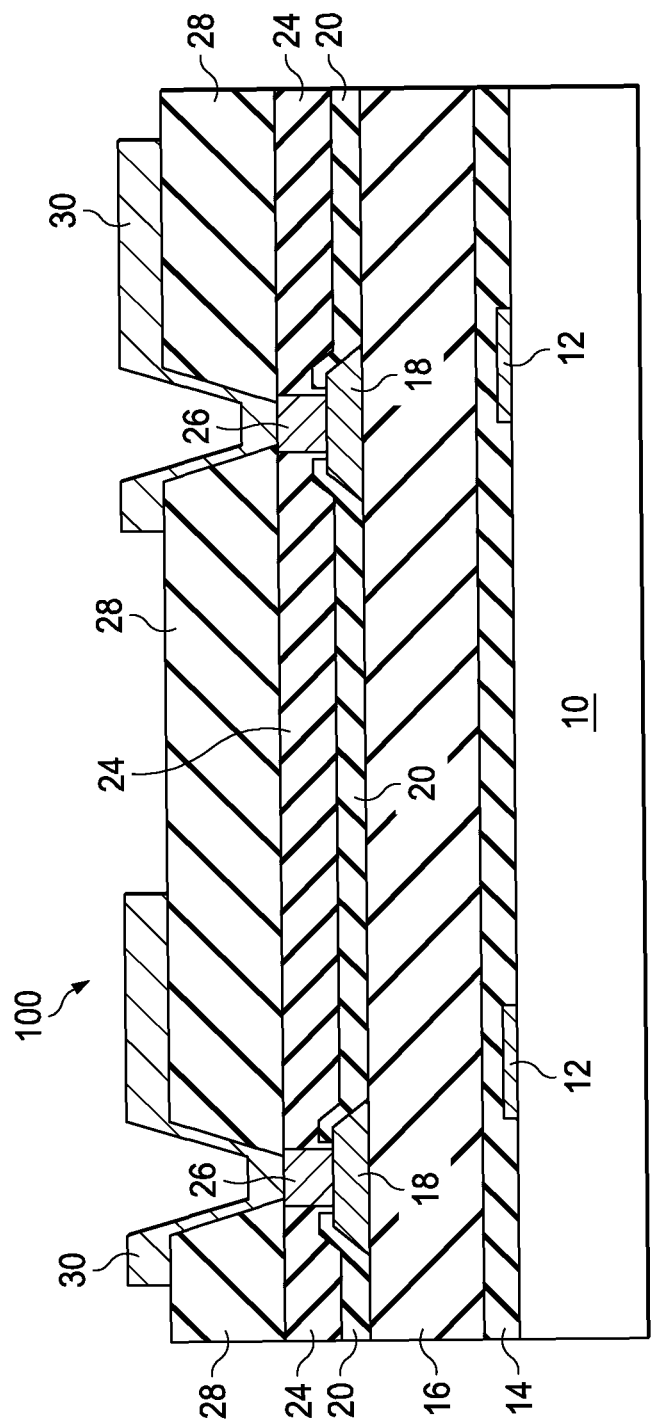

FIG. 4 shows the formation of a PPI structure 30 along sidewalls and bottom of the opening 29 in the second polymer layer 28, electrically connected to the PPI pad 26. The PPI structure 30 may extend to the surface of the second polymer layer 28 adjacent to the opening 29. The PPI structure 30 may also be referred to as an RDL structure because it allows I/O pads on the die 100 to be redistributed to a greater area than the die 100. The PPI structure 30 may alternatively be used to route electrical connections to a different region of die 100. The PPI structure 30 may be formed of copper or a copper alloy although other metals such as aluminum or gold may be used. The formation methods of PPI structure 30 may include plating, electroless plating, sputtering, chemical vapor deposition (CVD), and the like. Usually an opening is filled with the metal and surface of the substrate covered by the process. Excess metal is then removed. The surface may be planarized in a chemical mechanical polishing (CMP) process. In some embodiments, the PPI structure 30 and PPI pad 26 may be formed in the same process step. While FIG. 4 shows PPI structure 30 having only one PPI line; however in alternative embodiments, the PPI structure 30 may include multiple PPI lines formed in multiple polymer layers.

Figure 5:
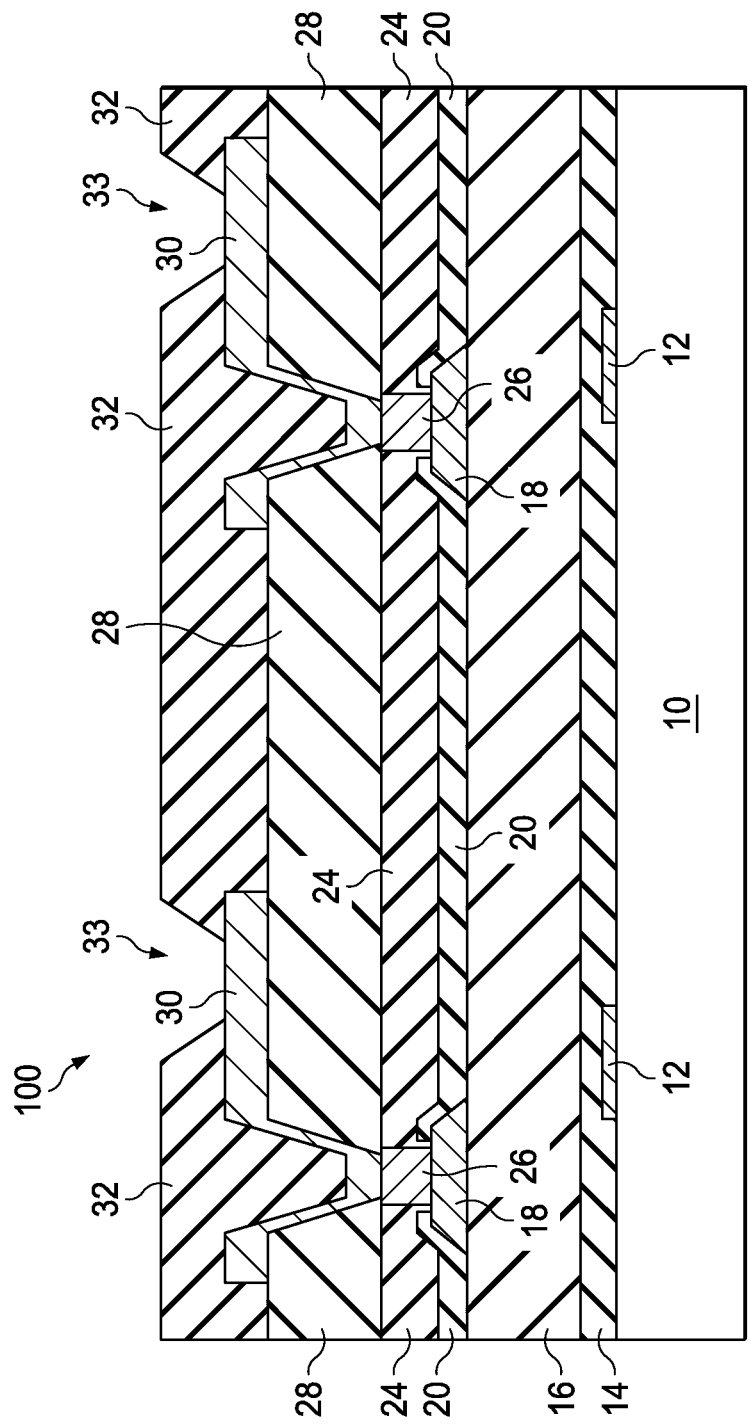

FIG. 5 shows the formation of a third polymer layer 32 over the PPI structure 30 and the second polymer layer 32. The third polymer layer 32 may be formed of the same materials and using the same techniques as the polymer layers 24 and 28 (e.g., a PBO layer using spin-on coating techniques), or may be formed of a different material and/or using different methods. The third polymer layer 32 is patterned to form openings 33 exposing the PPI structure 30, typically using the same methods as the methods used in patterning the first polymer layer 24 and/or the second polymer layer 28.

Figure 6:
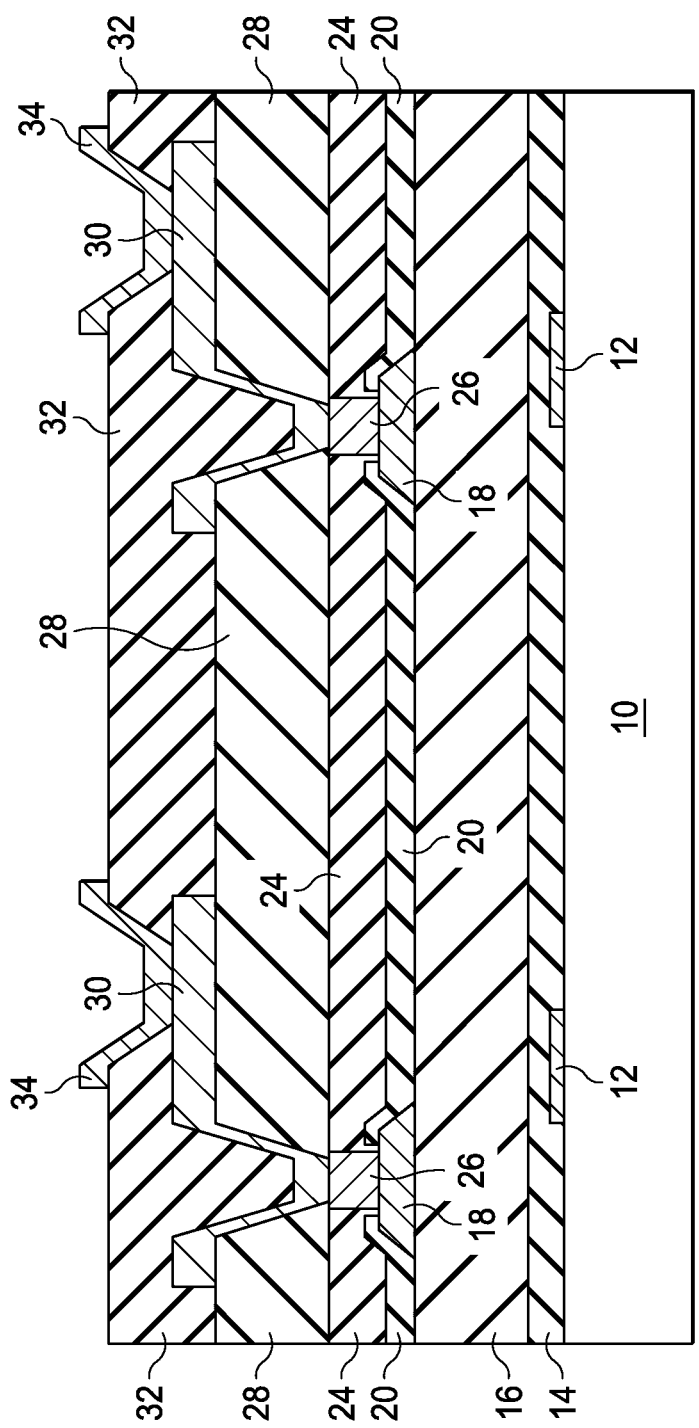

FIG. 6 illustrates the formation of under bump metallurgies (UBMs) 126 to extend into the openings 33 in the third polymer layer 32 and contact the PPI structure 30. The UBMs 34 may be formed of conductive materials such as copper, copper alloys, titanium, titanium alloys, or the like. In an embodiment, the UBM 126 include a titanium layer and a copper layer.

Figure 7:
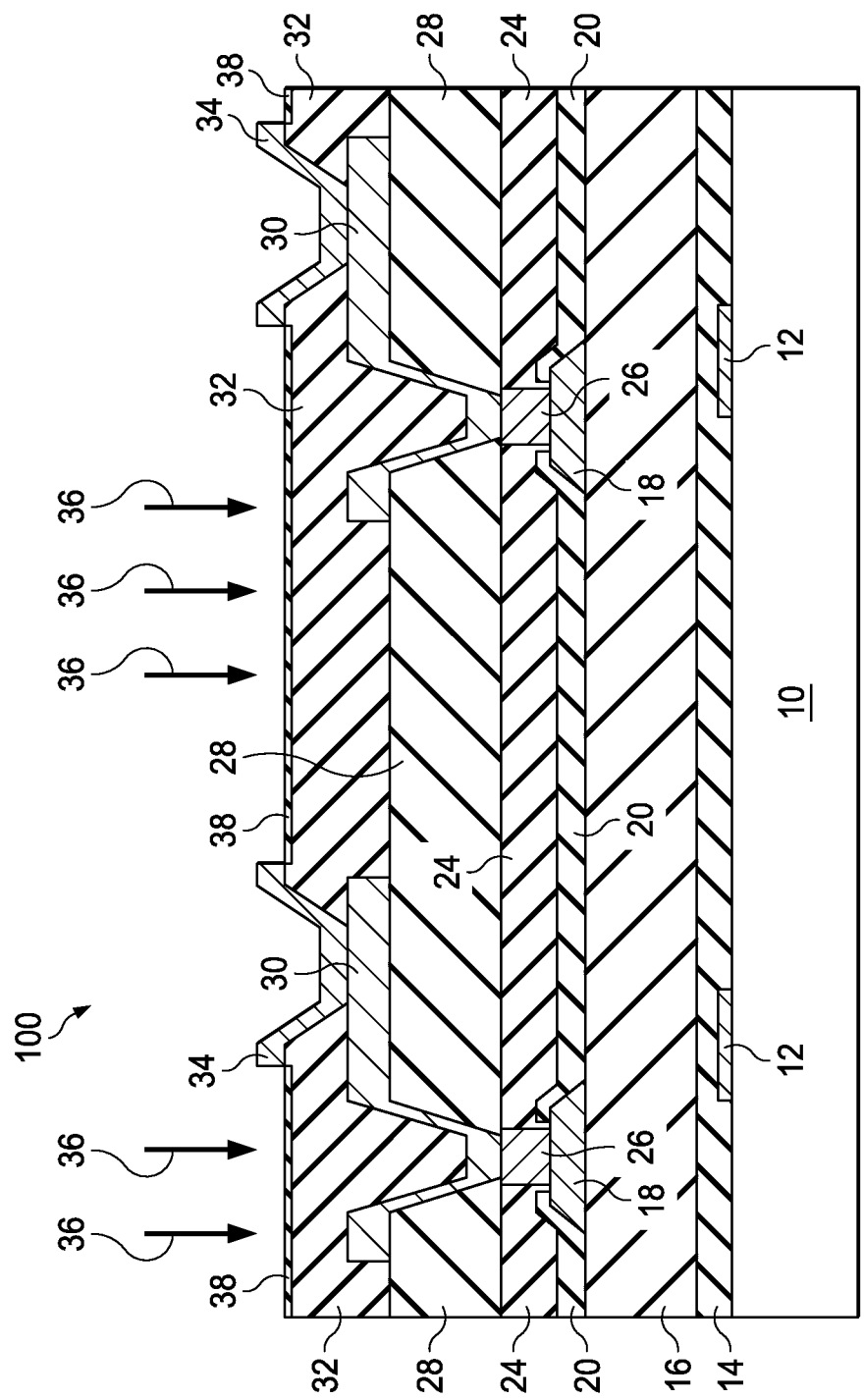

FIG. 7 illustrates a plasma treatment 36 performed on the resulted structure. The exposed surface of the third polymer layer 32 is condensed, and therefore the top surface of the third polymer layer 32 adjacent to the UBMs 34 forms a barrier layer 38 which can block moisture. In an embodiment, the plasma treatment 36 utilizes hydrogen containing plasma. The top surface of the third polymer layer 32 may be exposed to a hydrogen containing plasma. This may be done by exciting hydrogen gas using, for example, microwaves to ionize hydrogen gas and form hydrogen radicals. Therefore, the creation of hydrogen plasma introduces hydrogen ions on the top surface of the third polymer layer 32. A voltage may be applied under the substrate attracting the hydrogen ions and causing the hydrogen ions to react with the polymer material in the third polymer layer 32. Thus, a condensation layer, referred to as a barrier layer herein, is formed. In an embodiment, the barrier layer 38 is a polymer layer including hydrogen. In some embodiments, the barrier layer 38 has a thickness in a range of about 1 nm to about 10 nm. For example, the barrier layer 38 is about 7 nm thick. By performing the plasma treatment 36 and forming the barrier layer 38 on the third polymer layer 32, moisture that would otherwise penetrate into the third polymer layer 32 is blocked by the barrier layer 38 and delamination of the third polymer layer 32 is reduced or eliminated. For example, after subjecting various integrated circuits to the same PCT-168 hour reliability test as previously described, substantially fewer delamination issues between third polymer layer 32 and the PPI structure 30 were observed in integrated circuits having a thin oxide film layer.

Figure 8:
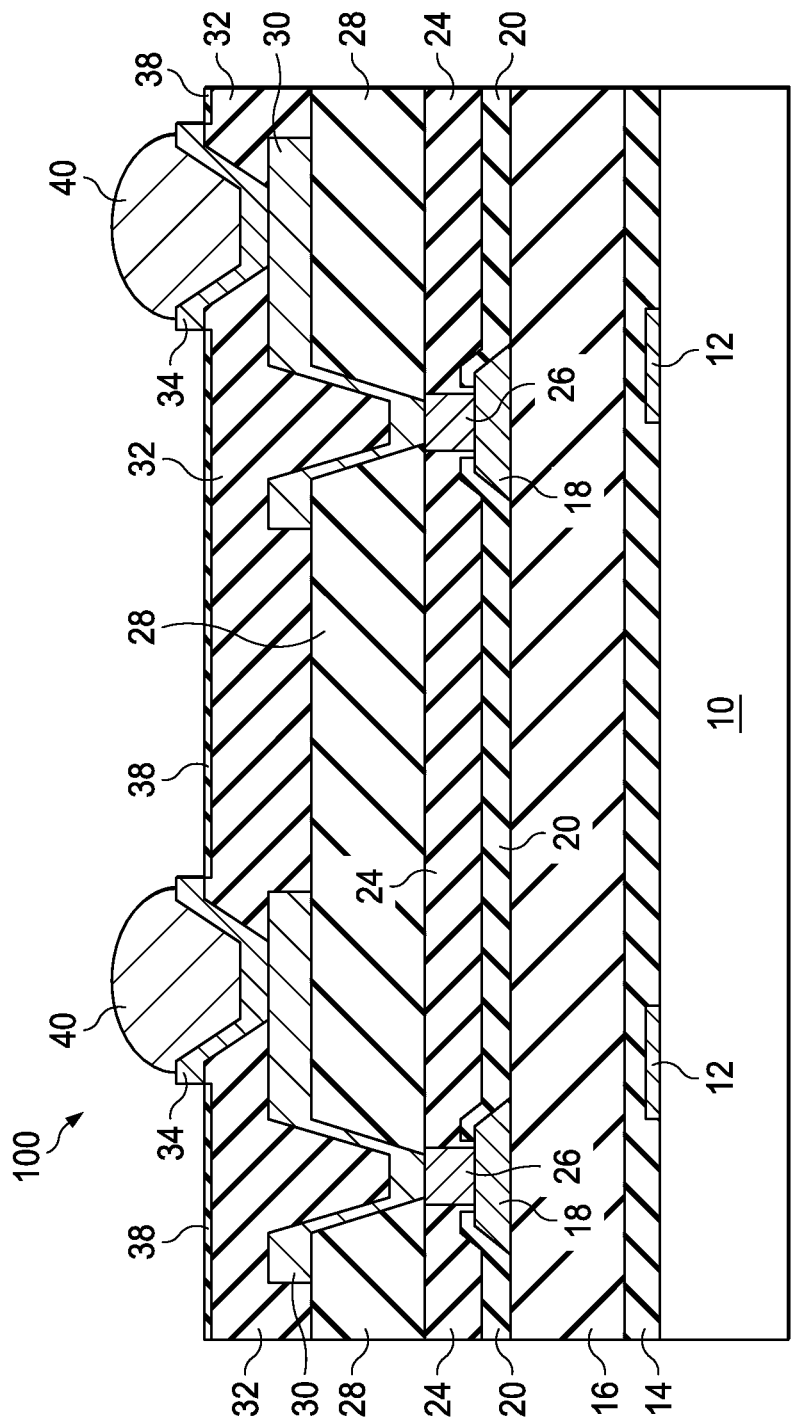

FIG. 8 illustrates the formation of bumps 40 formed on the UBMs 34. In some embodiments, the bumps 40 are solder balls, copper pillars, and the like. The bumps 40 are formed to electrically connect and bond to other package components such as a device die, an interposer, a printed circuit board (PCB), and the like.

Figure 9:
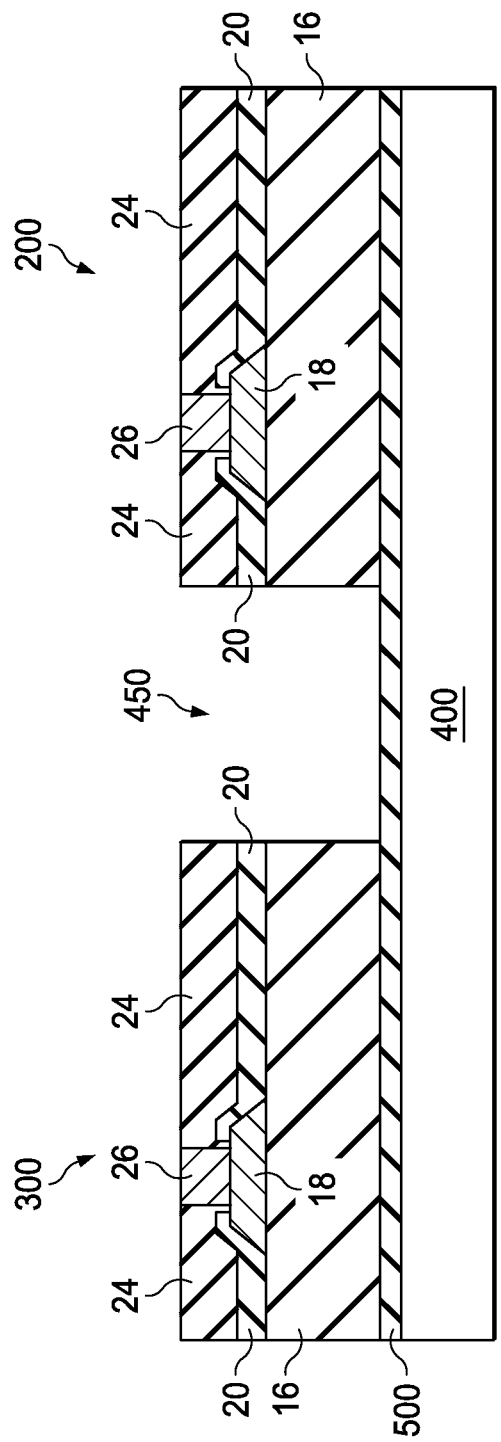
FIGS. 9-11 are cross-sectional views of various stages of manufacture of an integrated circuit structure in accordance with alternate embodiments.
Figure 10:
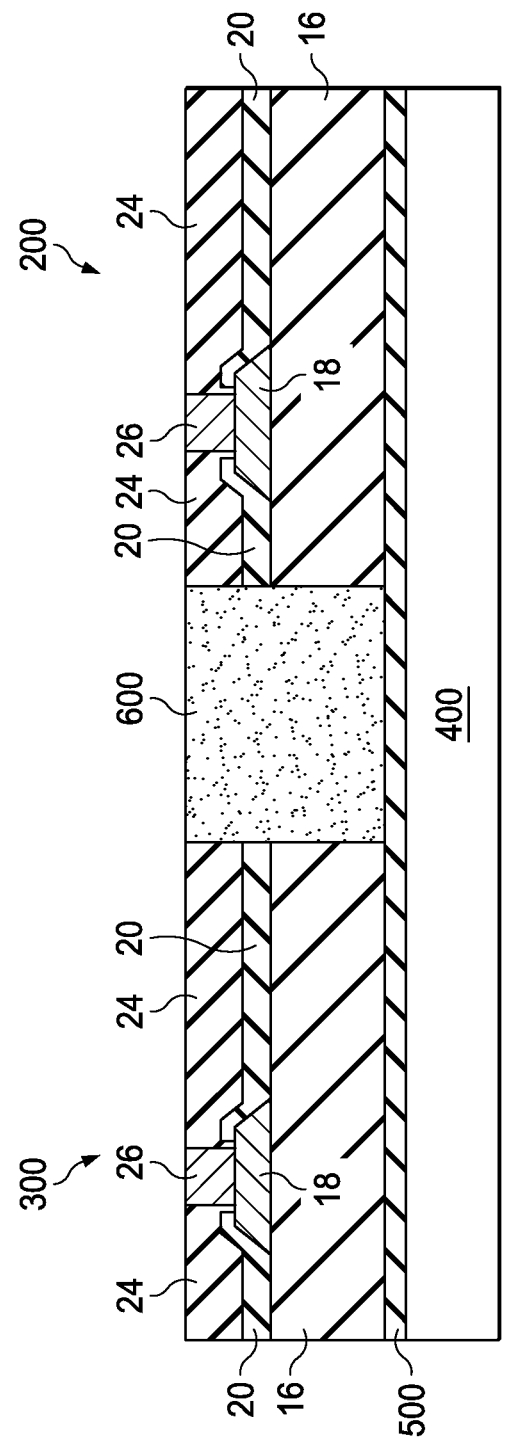
Figure 11:
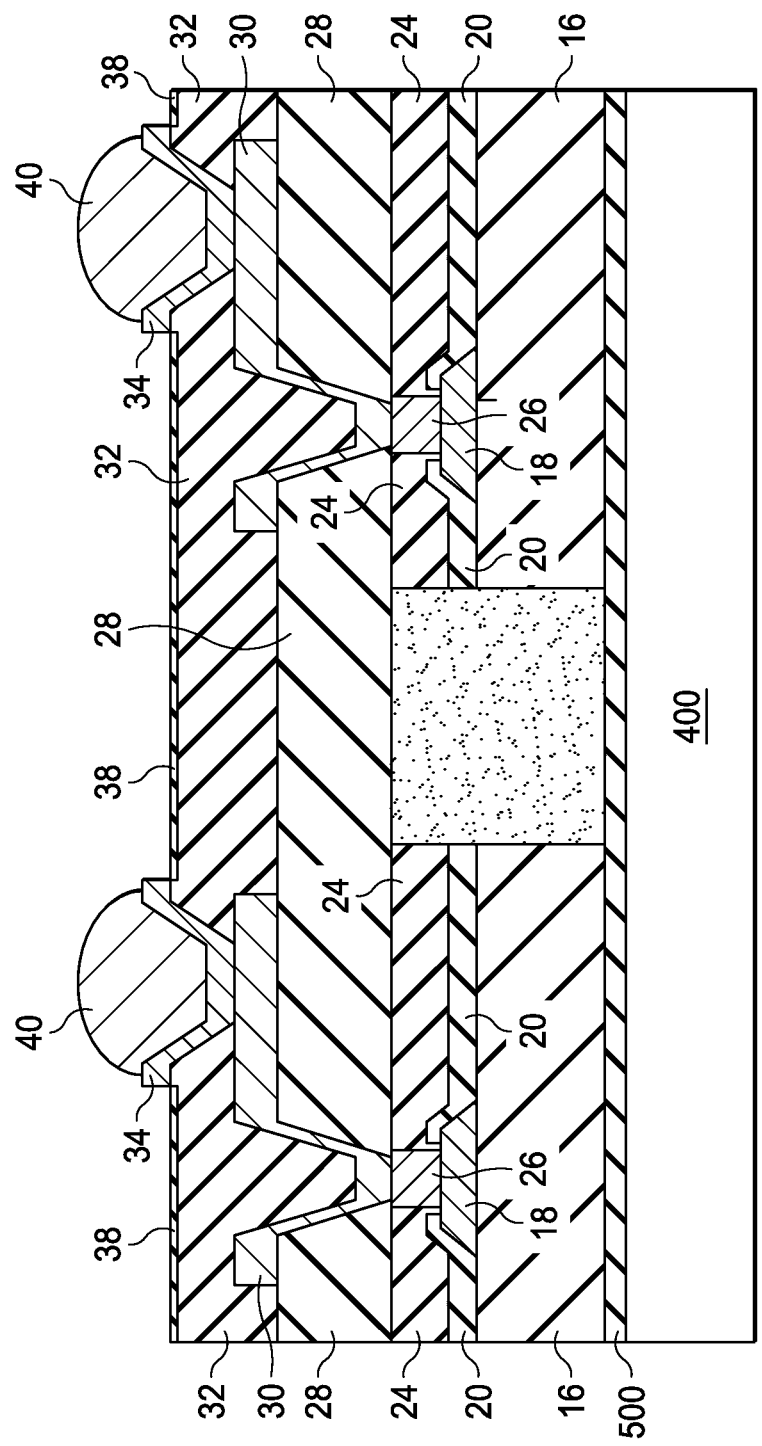

FIGS. 9-11 show various stages of manufacturing an integrated circuit structure according to alternative embodiments.

FIG. 9 illustrate multiple dies 200 and 300 disposed over a carrier 400 via an adhesive layer 500. Each of the multiple dies 200 and 300 includes the substrate 10, active devices 12, ILD 14, IMDs 16, metal pads 18, passivation layer 20, first polymer layer 24 and PPI pads 26, which are substantially similar to the features in FIG. 1-2. A pick and place machine may be used to place the dies 200 and 300 in predetermined locations on the carrier 400, for example. In some embodiments, the dies 200 and 300 are mounted face-up on the carrier wafer 200. The adhesive layer 500 may be formed of a glue, and carrier 400 may be made of silicon or glass in a wafer form.

FIG. 10 illustrates the filling of molding compound 600 filling spaces 450 between dies 200 and 300. The molding compound 600 may be an organic material such as an epoxy, which may be filled between dies 200 and 300 in liquid form. Subsequently, a curing process may be performed to solidify molding compound 600. A planarization, such as a grinding may be performed on molding compound 600 so that its top surface may be substantially level with the dies 200 and 300.

FIG. 11 illustrates the formation of subsequent polymer layers 28 and 32, PPI structure 30, UBMs 34, barrier layer 38, and bumps 40. These features are substantially similar to those previously discussed in FIGS. 3-8. Carrier 400 and adhesive layer 500 may be removed in a subsequent process step. In this manner, multiple dies may be packaged together to form FO-WLP including a thin oxide film layer that advantageously improves adhesion between the RDLs and an overlaying polymer layer.

In accordance with an embodiment, an method for forming an integrated circuit structure includes forming a post-passivation interconnect (PPI) structure over a substrate, wherein the substrate includes a metal pad and the PPI structure is electrically connected to the metal pad; forming a polymer layer over the PPI structure; forming an under bump metallurgy (UBM) extending into an opening in the polymer layer and electronically connected to the PPI structure; and performing a plasma treatment on the polymer layer.

In accordance with another embodiment, an integrated circuit structure includes a substrate, a metal pad over the substrate, a post-passivation interconnect (PPI) structure over the substrate and electronically connected to the metal pad, a first polymer layer over the PPI structure, an under bump metallurgy (UBM) extending into an opening in the first polymer layer and electronically connected to the PPI structure, and a barrier layer on a top surface of the first polymer layer adjacent to the UBM.

In accordance with yet another embodiment, an integrated circuit structure includes a first die, a second die and a molding compound filling a space between the first die and the second die, in which the first die includes a metal pad. The integrated circuit structure includes a post-passivation interconnect (PPI) structure overlying the first die and electrically connected to the metal pad, a first polymer layer over the PPI structure, a under bump metallurgy (UBM) formed in an opening in the first polymer layer and electrically connected the PPI structure, and a barrier layer on the top surface of the first polymer layer adjacent to the UBM.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for forming an integrated circuit structure, comprising:
   forming a first polymer layer over a substrate;
   forming a post-passivation interconnect (PPI) pad extending through the first polymer layer, wherein the substrate comprises a metal pad, and wherein the PPI pad is electrically connected to the metal pad;
   planarizing the PPI pad and the first polymer layer, wherein after the planarizing, the first polymer layer contacts sidewalls of the PPI pad from a bottom surface of the PPI pad to a top surface of the PPI pad;
   forming a second polymer layer over the first polymer layer and the PPI pad;
   forming a post-passivation interconnect (PPI) structure over the first polymer layer and the PPI pad, wherein the PPI structure is electrically connected to the metal pad, wherein the PPI structure extends into a first opening in the second polymer layer, and wherein the PPI structure extends along a top surface of the second polymer layer;
   forming a third polymer layer over the PPI structure;
   forming an under bump metallurgy (UBM) extending into a second opening in the third polymer layer, wherein the UBM is electronically connected to and in physical contact with the PPI structure; and
   after forming the UBM, performing a plasma treatment on the third polymer layer, wherein the plasma treatment comprises a hydrogen-containing plasma treatment which increases a hydrogen concentration of the third polymer layer, wherein a top surface of a product of the plasma treatment is co-planar with a horizontal surface of the UBM, wherein a sidewall of the product of the plasma treatment is vertically aligned with a sidewall of the UBM, and wherein performing the plasma treatment comprises exciting a hydrogen gas to ionize the hydrogen gas and form hydrogen radicals.

2. The method of claim 1, wherein the product of the performing the plasma treatment is a barrier layer formed along a top surface of the second polymer layer.

3. The method of claim 2, wherein the barrier layer has a thickness of 1 nm to 10 nm.

4. The method of claim 2, wherein the barrier layer is formed along the top surface of the third polymer layer, and wherein the barrier layer is adjacent to the UBM.

5. The method of claim 1, wherein forming the third polymer layer comprises:
   depositing the second polymer layer over the PPI pad and the first polymer layer; and
   patterning the second polymer layer to form the first opening, wherein the first opening exposes the top surface of the PPI pad.

6. The method of claim 1, wherein the third polymer layer is selected from polyimide (PI), polybenzoxazole (PBO), benzocyclobuten (BCB), epoxy, silicone, acrylates, nano-filled pheno resin, siloxane, fluorinated polymer, polynorbornene, or combinations thereof.

7. The method of claim 1, wherein a first portion of the third polymer layer is treated by the plasma treatment and a second portion of the third polymer layer is not treated by the plasma treatment, wherein the first portion has a hydrogen concentration higher than a hydrogen concentration of the second portion.

8. The method of claim 1, wherein the UBM comprises a titanium layer and a copper layer.

9. A method for forming an integrated circuit structure, comprising:
   providing a substrate with a metal pad;
   forming a first polymer layer with a first opening over the substrate to expose a portion of the metal pad;
   forming a second polymer layer with a second opening over the first polymer layer;
   forming a post-passivation interconnect (PPI) structure in electrical contact with the metal pad, wherein the PPI structure including a first portion extending into the second opening and a second portion extending along a top surface of the second polymer layer;
   depositing a third polymer layer over the PPI structure;
   removing a portion of the third polymer layer to form a third opening and expose at least a portion of the PPI structure;
   forming an underbump metallization (UBM) through the third opening, a portion of the UBM extending over a first portion of a surface of the third polymer layer facing away from the PPI structure, while leaving a second portion of the surface of the third polymer layer exposed, the UBM physically contacting the PPI structure; and
   exposing the third polymer layer to a plasma after the forming the UBM, the exposing of the third polymer layer to the plasma introducing hydrogen ions into the third polymer layer and forming a barrier layer from the second portion of the surface of the third polymer layer, the barrier layer having a hydrogen concentration greater than a hydrogen concentration of the third polymer layer, wherein a sidewall of the barrier layer is vertically aligned with a sidewall of the UBM.

10. The method of claim 9, wherein the plasma is produced at least in part by exciting hydrogen gas using microwaves.

11. The method of claim 10, wherein the substrate is a semiconductor substrate, and
wherein the exposing the third polymer layer is performed at least in part by applying a voltage under the semiconductor substrate.

12. The method of claim 9, further comprising forming a bump on the UBM after the exposing the third polymer layer.

13. The method of claim 9, further comprising forming a post-passivation interconnect (PPI) pad on the metal pad, the PPI pad extending through the first opening and electrically connecting the PPI structure to the metal pad.

14. The method of claim 9, the first polymer layer contacting entire sidewalls of the PPI pad in a cross-sectional view.

15. A method for forming an integrated circuit structure, comprising:
forming a first semiconductor die and a second semiconductor die separated from the first semiconductor die with an interval, wherein forming the first semiconductor die and the second semiconductor die each comprises:
forming a first opening in a first passivation layer to expose a metal pad;
forming a first polymer layer over the first passivation layer and the metal pad; and
forming a post-passivation interconnect (PPI) pad extending through the first opening and in electrical contact with the metal pad, wherein the first polymer layer contacts portions of the metal pad after forming the PPI pad;
filling the interval with an encapsulant;
planarizing the encapsulant such that a top surface of the first polymer layer, a top surface of each of the PPI pads, the first semiconductor die, the second semiconductor die, and the encapsulant are level with one another;
forming a second polymer layer over the first polymer layer, the PPI pads, and the encapsulant;
patterning the second polymer layer to form a second opening exposing the PPI pad of each of the first semiconductor die and the second semiconductor die;
forming a post-passivation interconnect (PPI) structure in the second opening and in electrical contact with the PPI pad of each of the first semiconductor die and the second semiconductor die, the PPI structure extending along a top surface of the second polymer layer;
depositing a third polymer layer over the PPI structure of each of the first semiconductor die and the second semiconductor die;
forming an underbump metallization (UBM) over each PPI structure, each UBM extending through the third polymer layer, and physically contacting the PPI structure of each of the first semiconductor die and the second semiconductor die; and
forming a barrier layer by exposing a portion of the third polymer layer to a hydrogen plasma, the barrier layer having a hydrogen concentration higher than a hydrogen concentration of an unexposed portion of the third polymer layer, wherein a sidewall of the barrier layer is vertically aligned with a sidewall of the UBM of each of the first semiconductor die and the second semiconductor die.

16. The method of claim 15, wherein the barrier layer extends over the encapsulant.

17. The method of claim 16, wherein the barrier layer also extends over the metal pad of the second semiconductor die.

18. The method of claim 15, wherein the planarizing the encapsulant is performed at least in part with a grinding process.

19. The method of claim 15, wherein the third polymer layer is PBO.

20. The method of claim 15, wherein the step of filling comprises flowing a liquid epoxy around the first semiconductor die and the second semiconductor die and curing the liquid epoxy.

* * * * *

UNITED STATES PATENT AND TRADEMARK OFFICE
CERTIFICATE OF CORRECTION

PATENT NO. : 11,081,475 B2
APPLICATION NO. : 15/443827
DATED : August 3, 2021
INVENTOR(S) : Jing-Cheng Lin et al.

It is certified that error appears in the above-identified patent and that said Letters Patent is hereby corrected as shown below:

In the Claims

Claim 9, Column 6, Line 47; delete "including" and insert --includes--.

Signed and Sealed this
Fifth Day of October, 2021

Drew Hirshfeld
*Performing the Functions and Duties of the
Under Secretary of Commerce for Intellectual Property and
Director of the United States Patent and Trademark Office*